United States Patent
Hong et al.

(10) Patent No.: US 7,923,323 B2
(45) Date of Patent: Apr. 12, 2011

(54) METAL CAPACITOR INCLUDING LOWER METAL ELECTRODE HAVING HEMISPHERICAL METAL GRAINS

(75) Inventors: Seok-Woo Hong, Gyeonggi-do (KR); Chang-Huhn Lee, Gyeonggi-do (KR); Jae-Hun Kim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 45 days.

(21) Appl. No.: 12/469,422

(22) Filed: May 20, 2009

(65) Prior Publication Data
US 2009/0246930 A1 Oct. 1, 2009

Related U.S. Application Data

(62) Division of application No. 11/609,857, filed on Dec. 12, 2006, now abandoned.

(30) Foreign Application Priority Data

Jan. 27, 2006 (KR) .................. 10-2006-0008701

(51) Int. Cl.
 *H01L 21/8242* (2006.01)
(52) U.S. Cl. .................. 438/239; 438/240; 438/241
(58) Field of Classification Search .................. 257/301, 257/304, 306–311; 438/239–256
 See application file for complete search history.

(56) References Cited

U.S. PATENT DOCUMENTS

| 6,677,217 B2* | 1/2004 | Joo et al. ............. 438/398 |
| 6,777,776 B2 | 8/2004 | Hieda |
| 7,034,353 B2 | 4/2006 | Thakur et al. |
| 2002/0019107 A1* | 2/2002 | Lin et al. .............. 438/396 |
| 2003/0040177 A1* | 2/2003 | Kim et al. ............. 438/678 |

FOREIGN PATENT DOCUMENTS

| JP | 2000-216356 | 8/2000 |
| KR | 10-0223831 | 7/1999 |
| KR | 2003-0000555 | 1/2003 |

OTHER PUBLICATIONS

English language abstract for Korean Publication No. 10-0223831.
English language abstract for Korean Publication No. 2003-0000555.
English language abstract for Japanese Publication No. 2000-216356.

* cited by examiner

*Primary Examiner* — Zandra V. Smith
*Assistant Examiner* — Paul E Patton
(74) *Attorney, Agent, or Firm* — F. Chau & Associates, LLC

(57) ABSTRACT

Disclosed is a metal capacitor including a lower electrode having hemispherical metal grains thereon. The metal capacitor includes a lower metal electrode containing Ti, hemispherical metal grains containing Pd and formed on the lower metal electrode containing Ti, a dielectric layer formed on the lower metal electrode containing Ti and the hemispherical metal grains containing Pd, and an upper metal electrode formed on the dielectric layer.

14 Claims, 10 Drawing Sheets

METAL CAPACITOR INCLUDING LOWER METAL ELECTRODE HAVING HEMISPHERICAL METAL GRAINS

CROSS-REFERENCE TO RELATED APPLICATION

This application is a Divisional of U.S. Ser. No. 11/609,857, filed on Dec. 12, 2006, now is pending, which claims priority from Korean Patent Application No. 10-2006-0008701 filed on Jan. 27, 2006, all of which are hereby incorporated by reference in their entirety.

BACKGROUND

1. Technical Field

The invention relates to a metal capacitor and a method of fabricating the same, and more particularly, to a metal capacitor including a lower metal electrode having hemispherical metal grains thereon and a method of fabricating such a metal capacitor.

2. Description of the Related Art

While thorough research into semiconductor techniques has been conducted, semiconductor devices, in particular, memory devices, have greatly improved. In addition, techniques for realizing high speeds, low power consumption, large capacity, and miniaturization have been extensively and intensively studied, and specifically, techniques for increasing the degree of integration are making rapid progress. A high degree of integration of a semiconductor device may be achieved by simultaneously developing circuit design techniques, materials and various process techniques.

In order to fabricate a semiconductor memory device having a high degree of integration and a large capacity, power consumption and operational voltage should be decreased in the interest of fast operation of the device, and capacitance suitable for stable operation of the capacitor should be ensured. Moreover, high capacitance of the capacitor is regarded as important with respect to the process of fabricating the semiconductor device.

With the goal of increasing the capacitance of the capacitor, there are proposed methods of increasing the dielectric constant of a dielectric layer, of increasing the area of upper/lower electrodes facing each other, and of decreasing the distance between upper/lower electrodes. Among these methods, a technique of roughening the surface of a lower electrode of a capacitor to increase the surface area thereof is receiving attention. This is because the technique of roughening the surface of the lower electrode of the capacitor enables the realization of high capacitance without increasing the volume or size of the capacitor, as in conventional methods. Thus, this technique is more favorable in terms of the degree of integration, compared to methods of altering the shape of the capacitor.

In the technique of roughening the surface of the lower electrode of the capacitor, a process of embossing the surface of the lower electrode of the capacitor is receiving a lot of attention. Specifically, hemispherical grains are formed on the lower electrode made of polycrystalline silicon, thus increasing the surface area of the lower electrode. Therein, the hemispherical grains are formed in a manner such that nuclei of the hemispherical grains are produced at a dangling bond site of polycrystalline silicon and then grown through deposition or out-diffusion.

However, the process of forming the hemispherical grains suffers because it may be applied only when using polycrystalline silicon, and cannot be used in a metal electrode structure of a next-generation capacitor which is operated at high speeds under conditions of a high degree of integration and reduced power consumption. In addition, when a reverse bias is applied to the capacitor using polycrystalline silicon to store data, a depletion region is enlarged. In this way, due to the enlargement of the depletion region, the distance between the upper and lower electrodes is increased, undesirably decreasing capacitance.

Therefore, in order to prevent the decrease of capacitance upon the application of a reverse bias, metal capacitors having upper and lower electrodes formed of metal have been proposed.

SUMMARY

Accordingly, the invention has been made keeping in mind the above problems occurring in the related art. In one embodiment, a metal capacitor comprising a lower metal electrode containing titanium; hemispherical metal grains containing palladium disposed on an upper surface of the lower metal electrode; a dielectric layer formed on the lower metal electrode and the hemispherical metal grains; and an upper metal electrode formed on the dielectric layer.

BRIEF DESCRIPTION OF THE DRAWINGS

The above and other objects, features and advantages of the invention will be more clearly understood from the following detailed description taken in conjunction with the accompanying drawings, in which.

DETAILED DESCRIPTION OF THE EXAMPLE EMBODIMENTS

Figure 1:
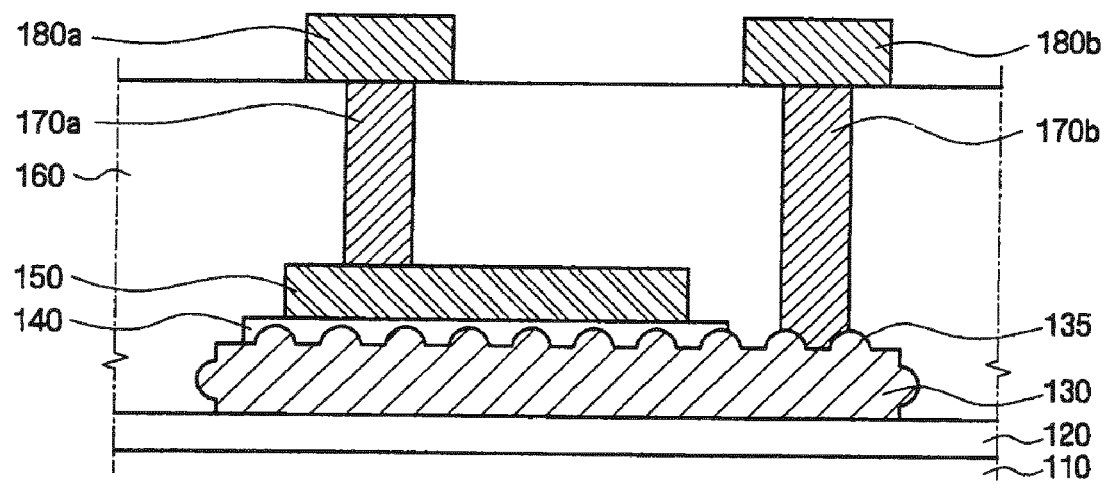
FIG. 1 is a longitudinal sectional view schematically showing a metal capacitor according to a first embodiment of the invention.

Reference now should be made to the drawings, in which the same reference numerals are used throughout the different drawings to designate the same or similar components. Further, the embodiments of the invention are described, with reference to plan views and cross-sectional views provided as ideal illustrations of the invention. As such, the sizes and shapes of illustrated elements may vary depending on the fabrication technique and/or allowable error. Thus, the embodiments of the invention are not limited to the specific shapes shown in the drawings but include changes in shape that depend on the fabrication process. Accordingly, regions shown in the drawings are schematically depicted, and the shapes thereof are set forth to illustrate the predetermined shapes of the regions of the device of the invention, but are not to be construed to limit the scope of the invention.

The metal capacitors and the fabrication methods thereof according to some embodiments of the invention will be understood with reference to FIGS. 1 to 6.

FIG. 1 is a longitudinal sectional view schematically showing the metal capacitor according to a first embodiment of the invention.

As shown in FIG. 1, a semiconductor device 100 of the invention comprises a first insulating layer 120 formed on a semiconductor substrate 110, a lower metal electrode 130 formed on the first insulating layer 120, hemispherical metal grains 135 formed on the lower metal electrode 130, a dielectric layer 140 formed on the lower metal electrode 130 and the hemispherical metal grains 135, an upper metal electrode 150 formed on the dielectric layer 140 to form a metal capacitor, a second insulating layer 160 formed on the upper metal electrode 150, via plugs 170a and 170b formed through the second insulating layer 160 to be electrically connected to the upper metal electrode 150 and the lower metal electrode 130, respectively, and wiring lines 180a and 180b electrically connected to the via plugs 170a and 170b, respectively.

The first insulating layer 120, which may be an interlayer insulating layer, may include silicon oxide. The lower metal electrode 130 may include a Ti-containing compound or alloy, or may include TiN.

Further, an additional metal layer (not shown) may be provided between the lower metal electrode 130 and the first insulating layer 120. The additional metal layer may include Ti. Also, the additional metal layer may be interposed between the lower metal electrode 130 and the first insulating layer 120 to increase adhesion therebetween.

The hemispherical metal grains 135 may contain Pd. The hemispherical metal grains 135 may be formed on substantially all surfaces of the lower metal electrode 130 to cover the lower metal electrode 130 therewith, or may alternatively be selectively formed to expose a portion of the lower metal electrode 130. The hemispherical metal grains 135 may be formed through an electroless plating process.

The dielectric layer 140 may be selectively formed on the upper surface of the lower metal electrode 130 that is covered with the hemispherical metal grains 135 as shown in the drawing, may be formed on substantially the entire upper surface of the lower metal electrode 130, or may be formed on substantially all surfaces of the lower metal electrode 130 not in contact with the first insulating layer 120. The dielectric layer 140 may include hafnium oxide, aluminum oxide, or other dielectric materials.

Although the upper metal electrode 150 is shown formed to a selective size on the dielectric layer 140 in FIG. 1, it may be formed only on the upper surface of the dielectric layer 140 when the dielectric layer 140 is formed only on the upper surface of the lower metal electrode 130. In addition, if the dielectric layer 140 is formed over the substantially entire surface of the lower metal electrode 130, the upper metal electrode 150 may be formed over the substantially entire surface of the dielectric layer 140.

The upper metal electrode 150, the via plugs 170a, 170b, and the wiring lines 180a and 180b may include at least one selected from silicon-containing metals, Ti, copper, tungsten, aluminum, other metals, metal compounds, and alloys thereof. The second insulating layer 160 may be formed on the lower metal electrode 130, the hemispherical metal grains 135, and the upper metal electrode 140. The second insulating layer 160 may include silicon oxide. Further, on the second insulating layer 160, an additional insulating layer (not shown) may be comprised silicon nitride and/or silicon oxynitride.

Figure 2:
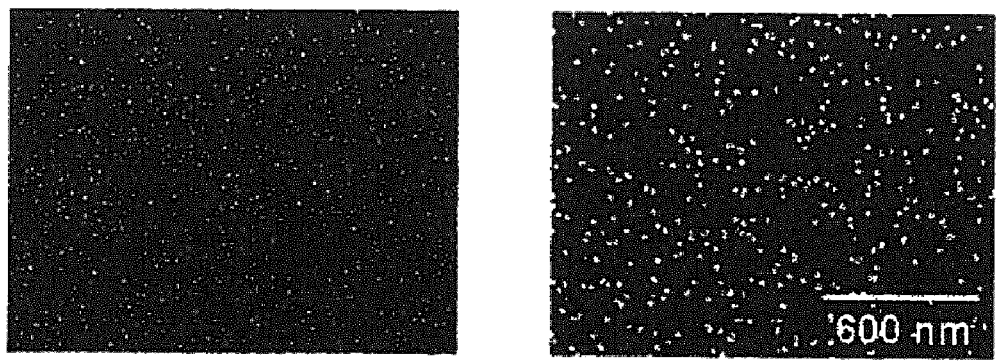
FIG. 2 is an electron micrograph showing the hemispherical metal grains formed on the lower metal electrode of the capacitor.

FIG. 2 is an electron micrograph showing the hemispherical metal grains 135 formed on the lower metal electrode 130. As shown in FIG. 2, very small hemispherical metal grains 135 are irregularly formed on the lower metal electrode 130. The size of the hemispherical metal grains 135 may be adjusted by controlling the reaction time in the fabrication process. In the drawing, the left micrograph shows the result of reaction for ones of seconds, while the right micrograph shows the result of reaction for tens of seconds. From these micrographs, the size of the hemispherical metal grains 135 is confirmed to increase depending on the reaction time.

Figure 3:
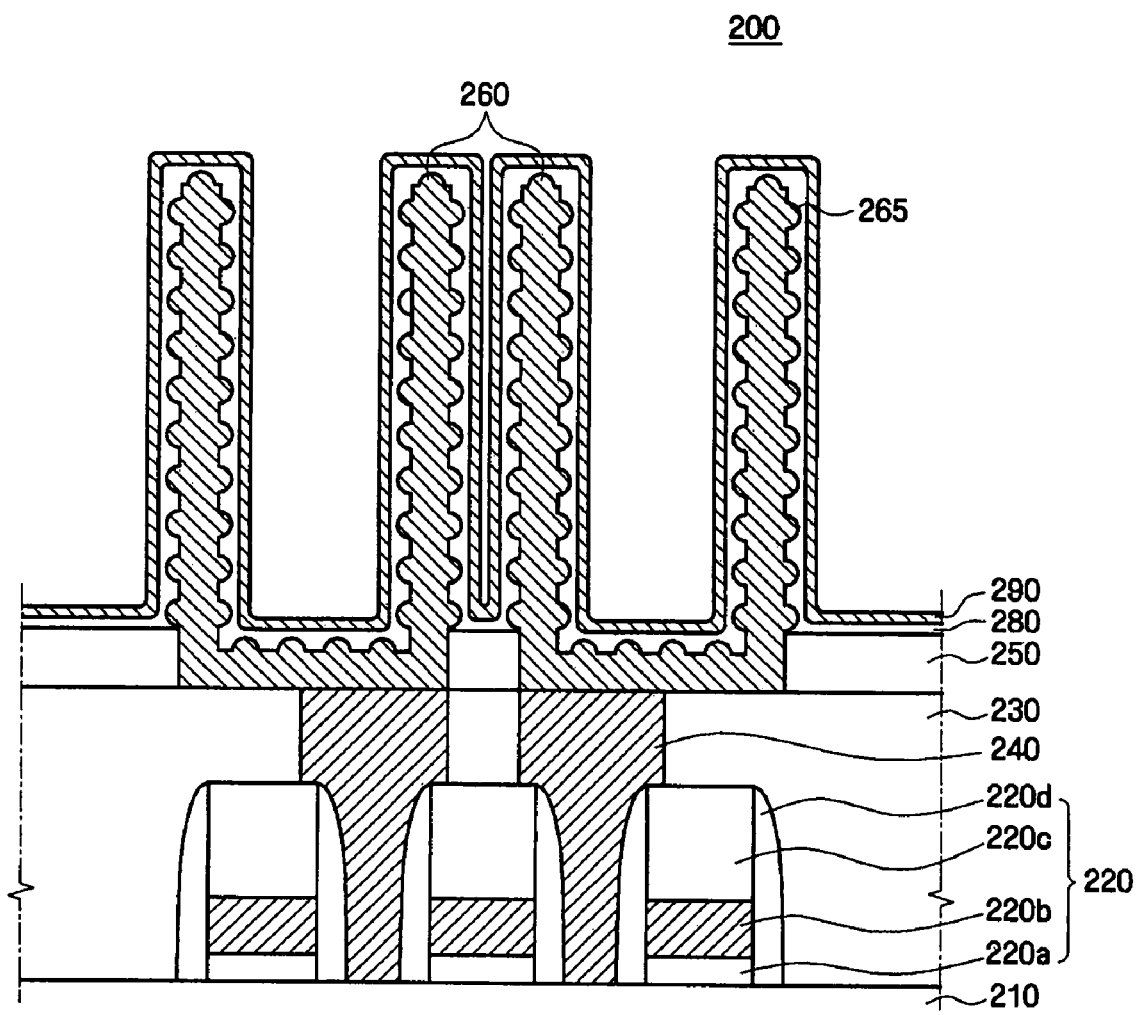
FIG. 3 is a longitudinal sectional view schematically showing a metal capacitor according to a second embodiment of the invention.

FIG. 3 is a cross-sectional view schematically showing a semiconductor device 200 including a metal capacitor according to a second embodiment of the invention. Specifically, a cylinder-shaped capacitor used in a semiconductor device such as a DRAM is illustrated.

As shown in FIG. 3, the semiconductor device 200 including the metal capacitor according to the second embodiment of the invention comprises a plurality of transistors 220 formed on a semiconductor substrate 210, a first insulating layer 230 formed over the plurality of transistors 220, via plugs 240 formed through the first insulating layer to be electrically connected to the substrate 210, a second insulating layer 250 formed on the first insulating layer 230 and having holes for exposing the upper portions of the via plugs 240, a lower metal electrode 260 which is in contact with the exposed upper portions of the via plugs 240 and the sidewalls of the holes and which is formed to have inner and outer walls, hemispherical metal grains 265 formed on the lower metal electrode 260, a dielectric layer 280 formed on the lower metal electrode 260 and the hemispherical metal grains 265, and an upper metal electrode 290 formed on the dielectric layer 280.

Each of the transistors 220 may include a gate insulating layer 220a formed on the substrate 210, a gate electrode 220b formed on the gate insulating layer 220a, a gate electrode capping layer 220c formed on the gate electrode 220b, and a gate spacer 220d formed on the side walls of the gate insulating layer 220a, the gate electrode 220b, and the gate electrode capping layer 220c. The gate insulating layer 220a may include silicon oxide or other suitable gate dielectric material, and the gate electrode 220b may include at least one selected from polycrystalline silicon, silicon-containing metals, metal compounds, metals, and alloys thereof. The gate electrode capping layer 220c and the gate spacer 220d may include, for example, silicon nitride. In the substrate 210, source/drain regions which are not shown may be formed through, for example, ion implantation.

The via plug 240 is formed of at least one selected from polycrystalline silicon, metals, silicon-containing metals, metal compounds, and alloys thereof. The first insulating layer 230 may include silicon oxide. The lower metal electrode 260 may include a Ti-containing compound or alloy, or may include TiN. Further, an additional metal layer may be provided between the lower metal electrode 260 and the hole. The metal layer may include Ti. The metal layer may be interposed between the lower metal electrode 260 and the second insulating layer 250 to increase adhesion therebetween.

The hemispherical metal grains 265 may be formed on the inner and outer walls of the lower metal electrode 260 and on the upper surface thereof. The dielectric layer 280 may include hafnium oxide, aluminum oxide, or other dielectric materials. The upper metal electrode 290 may include at least one selected from silicon-containing metals, Ti, tungsten, copper, aluminum, other metals, metal compounds, and alloys thereof. The hole may be formed to be larger than the upper surface of the via plug 240 so as to increase the alignment margin for the fabrication process.

Below, methods of fabricating a metal capacitor according to the preferred embodiments of the invention are described with reference to the appended drawings. Many of the steps described below may be accomplished through standard photolithographic techniques known in the art of semiconductor fabrication.

FIGS. 4A to 4D are views showing the process of fabricating the metal capacitor, according to the first embodiment of the invention.

Figure 4A:
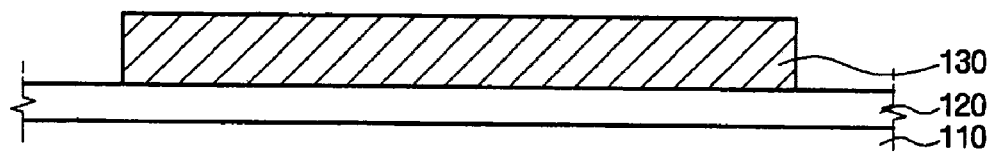
FIGS. 4A to 4D are views showing the process of fabricating the metal capacitor according to the first embodiment of the invention.

As shown in FIG. 4A, the first insulating layer 120 is formed on the substrate 110, and the lower metal electrode 130 is formed on the first insulating layer 120. Particularly, a metal layer is formed over the first insulating layer 120 and then patterned into the desired shape. The process of forming the lower metal electrode 130 is well known in the art, and thus a detailed description thereof is omitted for the sake of simplicity. The first insulating layer 120 may include silicon nitride. The lower metal electrode 130 may include a Ti-containing compound or alloy, or may include TiN. Further, an additional metal layer may be provided between the lower metal electrode 130 and the first insulating layer 120. The additional metal layer may include Ti. This metal layer functions to increase adhesion between the lower metal electrode 130 and the first insulating layer 120.

Figure 4B:
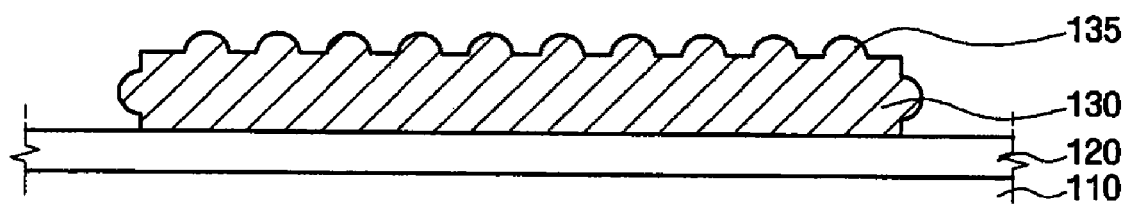

As shown in FIG. 4B, the hemispherical metal grains 135 are formed on the lower metal electrode 130. Specifically, the metal lower electrode 130 is dipped into an electrolyte solution and allowed to react, thereby producing and growing the hemispherical metal grains on the lower metal electrode 130. The specific electrolyte solution used in the invention is noted below.

Figure 4C:
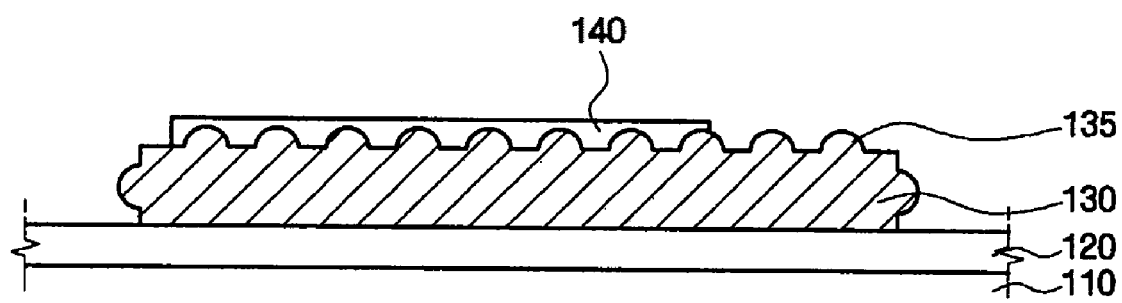

Subsequently, as shown in FIG. 4C, the dielectric layer 140 is formed on the lower metal electrode covered with the hemispherical metal grains 135. In FIG. 4C, the dielectric layer 140 may be selectively formed on the upper surface of the lower metal electrode 130, may be formed on substantially the entire upper surface of the lower metal electrode 130, or may be formed on substantially all surfaces of the lower metal electrode 130 not in contact with the first insulating layer 120. The dielectric layer 140 may include hafnium oxide, aluminum oxide, or other dielectric materials. Further, the dielectric layer 140 may include several materials or material layers.

Figure 4D:
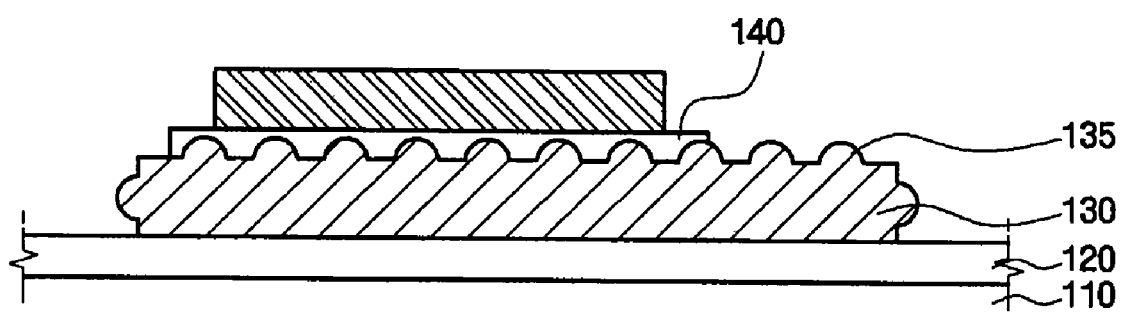

As shown in FIG. 4D, the upper metal electrode 150 is formed on the dielectric layer 140. In FIG. 4D, the upper metal electrode 150 is formed to a defined size on the dielectric layer 140. However, when the dielectric layer 140 may be formed only on the upper surface of the lower metal electrode 130, the upper metal electrode 150 may be formed only on the upper surface of the dielectric layer 140. Alternatively, if the dielectric layer 140 is formed all over the lower metal electrode 130, the upper metal electrode 150 may be formed covering substantially the entire surface of the dielectric layer 140. The upper metal electrode 150 may include at least one selected from silicon-containing metals, Ti, tungsten, copper, aluminum, other metals, metal compounds, and alloys thereof.

Thereafter, the via plugs, which are electrically connected to the lower metal electrode 130 and the upper metal electrode 150, and the wiring lines, which are electrically connected to the via plugs, may be formed.

Turning now to FIGS. 5A to 5F, there are provided views showing the process of fabricating the metal capacitor according to the second embodiment of the invention, and in particular, views showing the process of fabricating a cylinder-shaped metal capacitor used in a semiconductor device such as a DRAM.

Figure 5A:
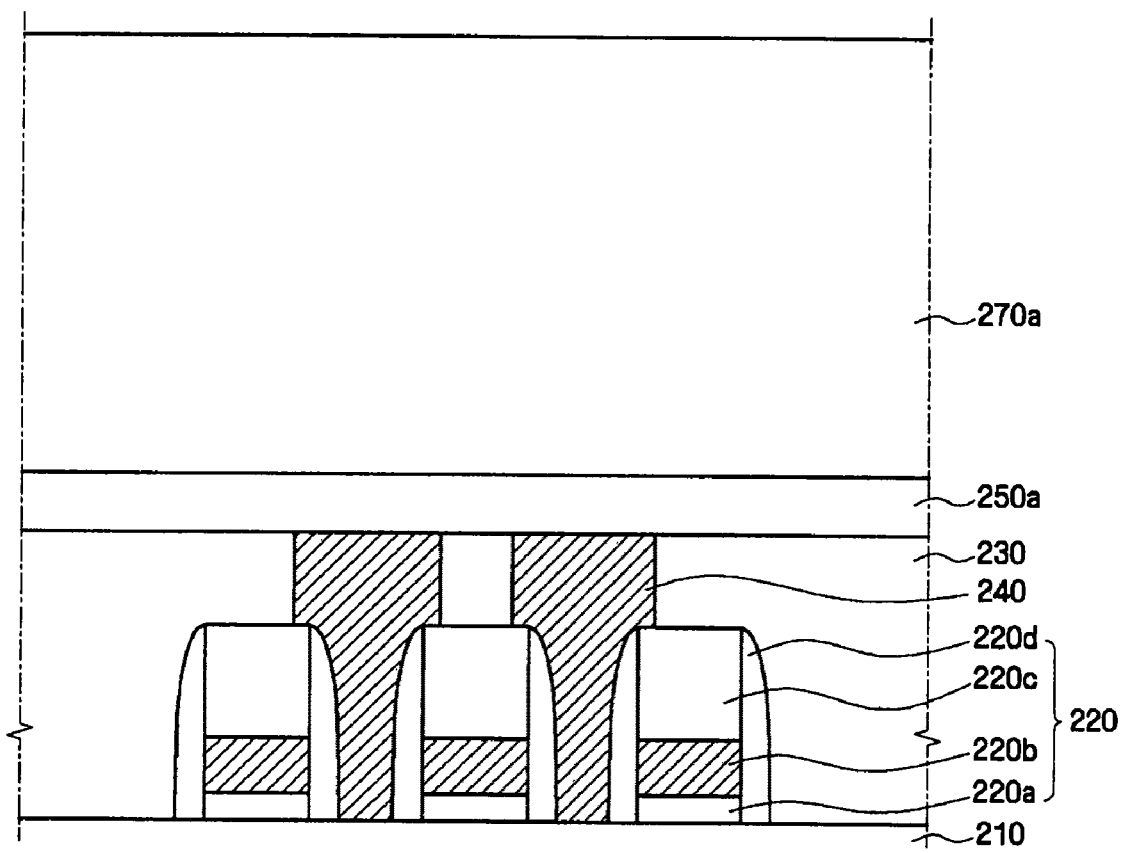
FIGS. 5A to 5F are views showing the process of fabricating the metal capacitor according to the second embodiment of the invention.

As shown in FIG. 5A, the transistors 220, each including the gate insulating layer 220a, the gate electrode 220b, the gate electrode capping layer 220c, and the gate spacer 220d, are formed on the substrate 210. Further, although not shown, source/drain regions and a device isolation region may be formed on/in the substrate 210. The transistor 220 may be formed using well-known techniques, thus a detailed description thereof is omitted for the sake of simplicity.

Thereafter, the first interlayer insulating layer 230 is formed over the transistors 220. The first interlayer insulating layer comprises silicon oxide. Next, via holes are formed through the first interlayer insulating layer 230 to expose the portions of the substrate 210, and then filled with a conductive material, thus forming the via plugs 240. The via plug 240 may include at least one selected from polycrystalline silicon, silicon-containing metals, Ti, tungsten, copper, aluminum, other metals, metal compounds, and alloys thereof.

Then, a capping layer 250a is formed on the first interlayer insulating layer 230 and the via plugs 240. The capping layer 250a may include silicon nitride. Although the via plug 240 and the capping layer 250a are sequentially formed in FIG. 5A, the sequence thereof may be changed. In other words, the order in which the steps are described does not imply that the operations are order-dependent or that the order that steps are performed must be the order in which the steps are presented. For example, the capping layer 250a may be formed first, after which the via hole is formed through the capping layer 250a and the first interlayer insulating layer 230 to expose the part of the substrate 210 and then filled with conductive material, thus forming the via plug 240. In this way, if the above process is performed, the via plug 240 of FIG. 5A may be exposed through the capping layer 250a. Subsequently, a second interlayer insulating layer 270a is provided on the capping layer 250a. The second interlayer insulating layer 270a may comprise silicon oxide.

Figure 5B:
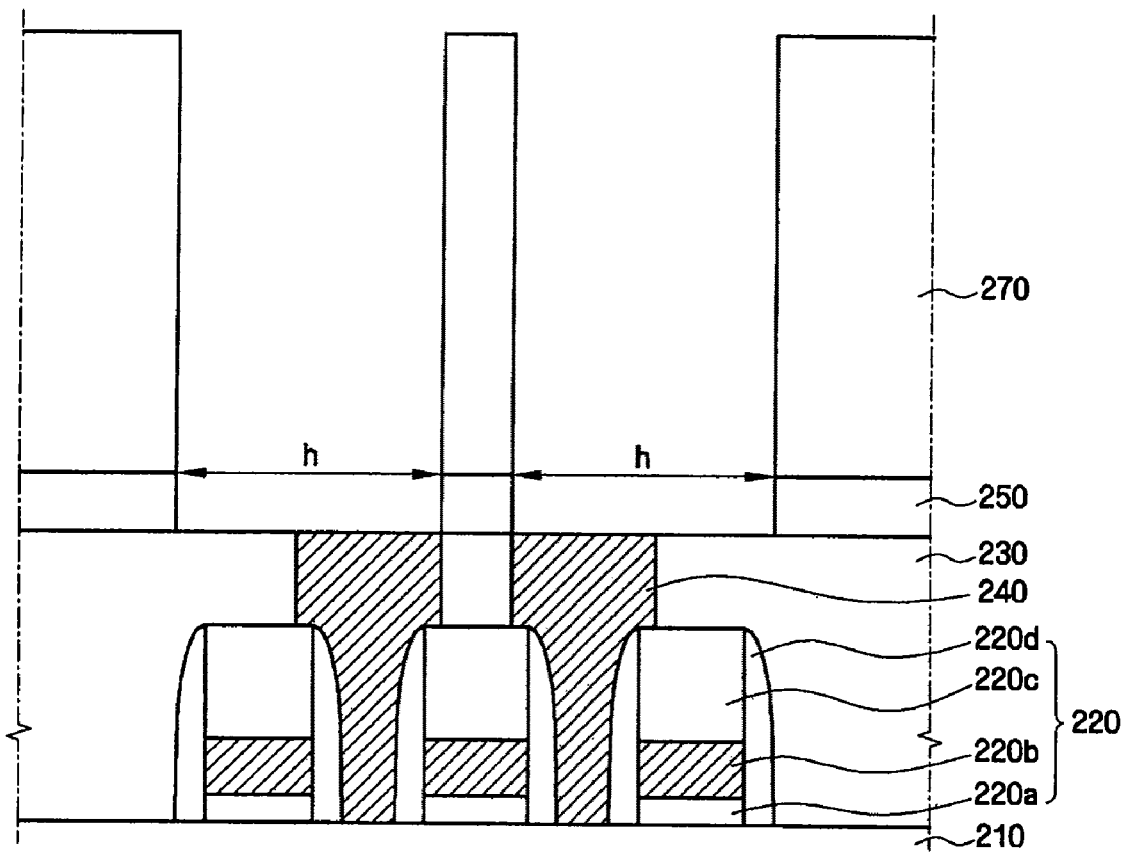

As shown in FIG. 5B, holes h are formed through the second interlayer insulating layer 270a and the capping layer 250a to expose the upper surfaces of the via plugs 240. Although the via plug 240 and the hole h are shown to be aligned in the drawing, they may not be aligned in practice. The diameter of the hole may be larger than the length of the exposed upper surface of the via plug 240.

Figure 5C:
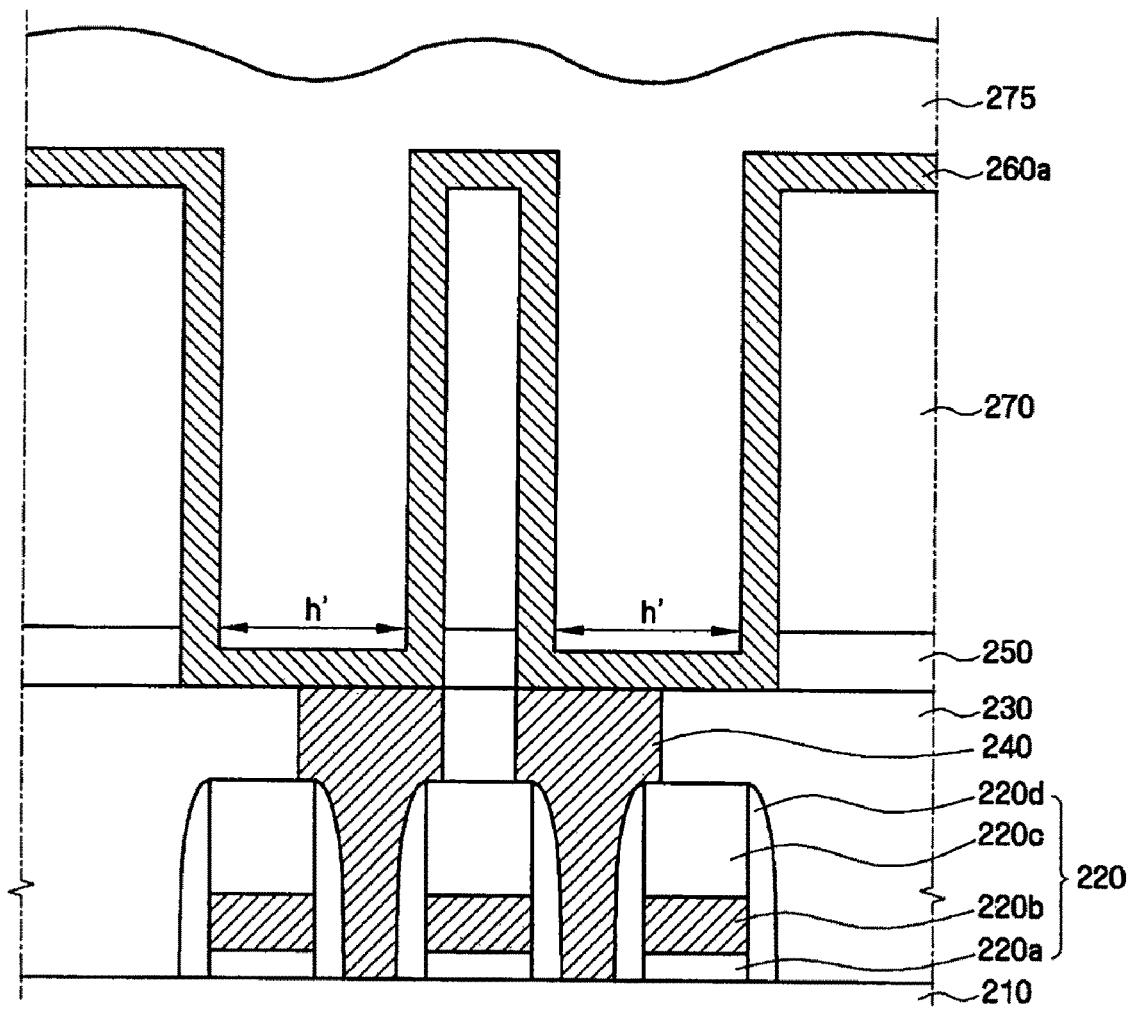

As shown in FIG. 5C, a metal layer 260a for forming the lower metal electrode is formed in the holes h to form the lower electrode therein, and a sacrificial material layer 275 for separating the lower metal electrode is formed in the holes h and on the metal layer 260a for forming the lower metal electrode. The metal layer 260a for forming the lower metal electrode may include a Ti-containing compound or Ti alloy, or may include TiN. The material layer 275 for separating the lower metal electrode may include a polymer organic material or inorganic material such as silicon oxide. Further, an intermediate metal layer (not shown) may be provided among the metal layer 260a for forming the lower metal electrode, the capping layer 250, and the second interlayer insulating layer 270. The intermediate metal layer may include Ti, and is provided to increase the adhesion between the lower metal electrode and the other films. For example, in FIG. 5C, the intermediate metal layer may be provided on the bottom surface and side wall of the second interlayer insulating layer 270, the side wall of the capping layer 250, the upper portion of the first interlayer insulating layer 230, and the upper portion of the via plug 240.

In addition, the invention is not limited to the embodiment shown in FIG. 5C. For example, the intermediate metal layer may be not brought into contact with any one of the four films. Moreover, if an additional film is provided, the above metal layer may be provided where it comes into contact with the additional film.

Figure 5D:
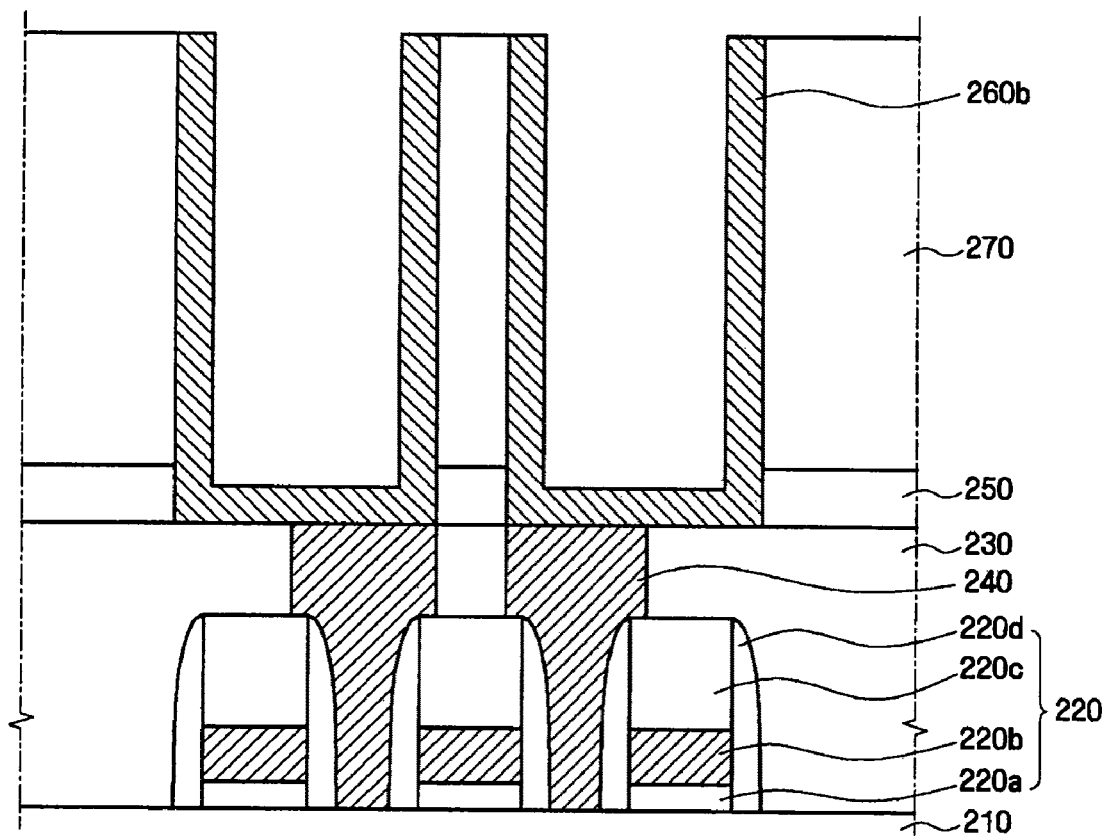

Subsequently, as shown in FIG. 5D, the sacrificial material layer 275 for separating the lower metal electrode and the upper portion of the metal layer 260a for forming the lower metal electrode are removed. Thus, the lower metal electrode 260 is formed.

If the material layer 275 for separating the lower metal electrode is formed of polymer organic material, an etchback process may be conducted. Thus, the metal layer 260a for forming the lower metal electrode formed on the second interlayer insulating layer 270, which is exposed through the top surface of the material layer 275 for separating the lower metal electrode, is selectively etched, thereby forming the lower metal electrode 260b. Thereafter, the remaining portion of the sacrificial material layer 275 for separating the lower metal electrode is removed.

In addition, the lower metal electrode 260b may be formed in a manner such that holes h' are filled with inorganic material and then a CMP process is performed. As such, if the inorganic material such as silicon oxide is employed and the CMP process is conducted, the step of FIG. 5E may directly follow the step of FIG. 5C, without the need for the step of FIG. 5D.

Figure 5E:
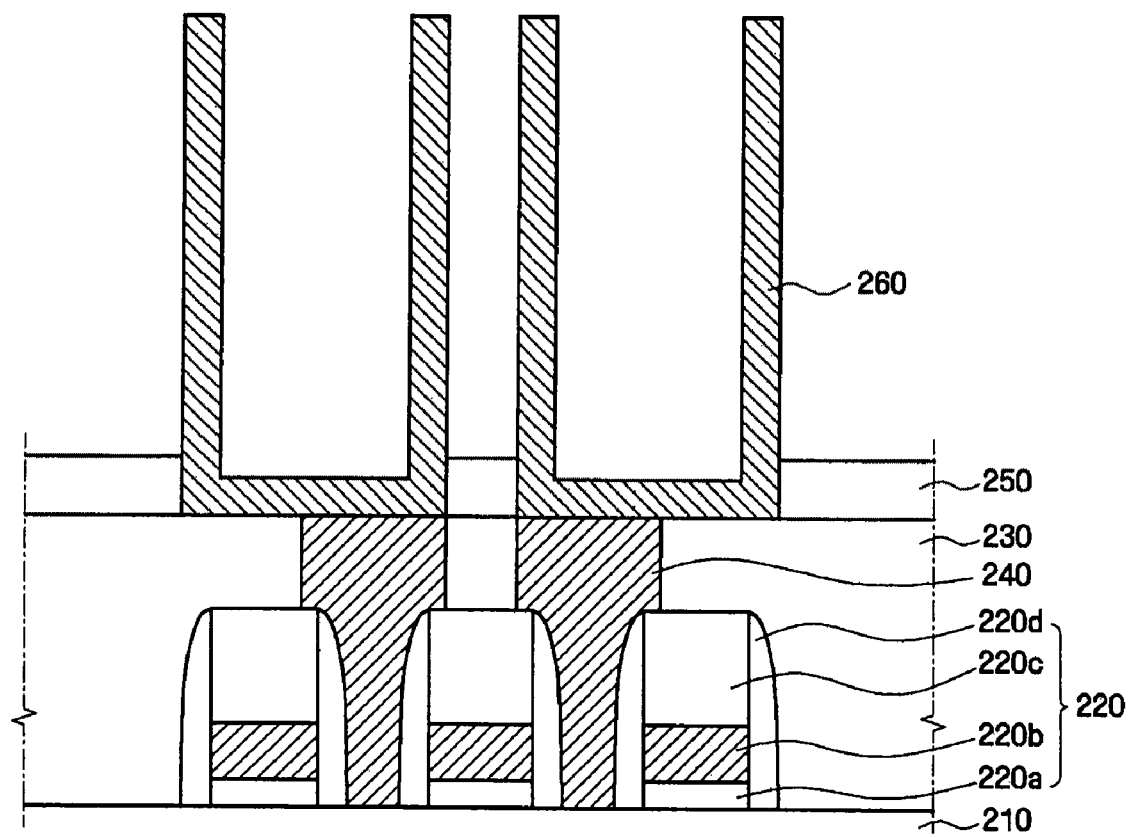

As shown in FIG. 5E, the second interlayer insulating layer 270 is then removed, thus exposing the inner wall and the outer wall of the lower metal electrode 260b. The process of removing the second interlayer insulating layer may be conducted using a diluted hydrofluoric acid solution.

Figure 5F:
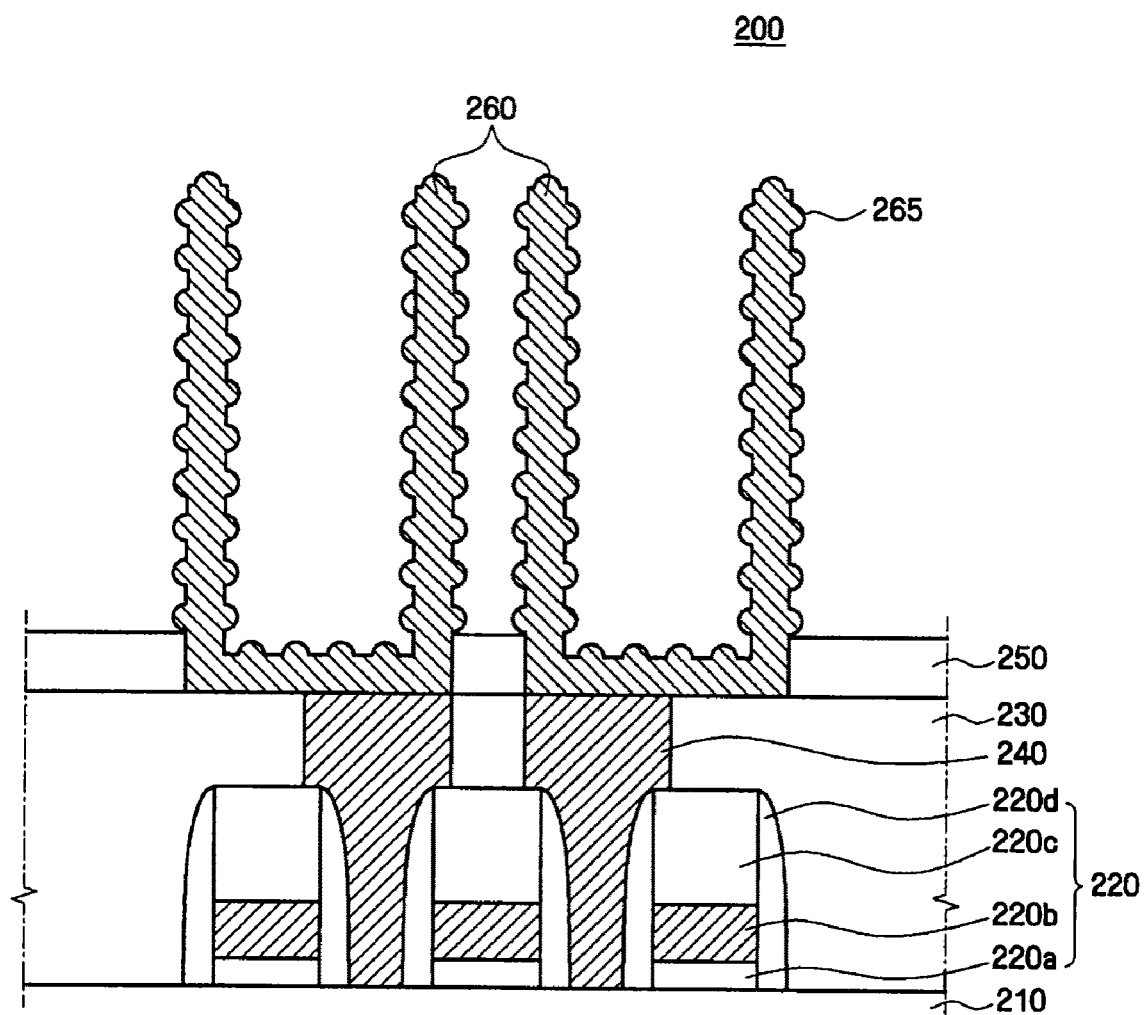

As shown in FIG. 5F, the hemispherical metal grains 265 are formed on the lower metal electrode 260b by, for example, dipping the lower metal electrode 260b into an electrolyte solution containing, for example, Pd. Particularly, the lower metal electrode 260b is dipped into an electrolyte solution containing Pd, in order to induce substitution between a Ti atom contained in the lower metal electrode 260b and a Pd atom. Upon the substitution, nuclei of metal grains containing Pd are produced and then grown on the lower metal electrode 260b, thereby forming the hemispherical metal grains 265. A detailed description of the electrolyte solution and the substitution is provided below.

Thereafter, the surface of the lower metal electrode 260 having the hemispherical metal grains 265 thereon is covered with the dielectric layer 280, and the dielectric layer 280 is covered with the upper metal electrode 290, thereby forming the metal capacitor 200 according to the second embodiment shown in FIG. 3. The dielectric layer 280 may include hafnium oxide, aluminum oxide, or other dielectric materials. The upper metal electrode 290 may include at least one selected from silicon-containing metals, Ti, tungsten, copper, aluminum, other metals, metal compounds, and alloys thereof.

According to some embodiments, the electrolyte solution includes a Pd source, a complexing agent, hydrofluoric acid, an acidity controlling agent, and a reducing agent. The Pd source may be exemplified by $PdCl_2$. Alternatively, other compounds may be provided as the Pd source, and the amount of the Pd source may be smaller or larger than the amount given in Table 1 below. The proportion of $PdCl_2$ may affect the substitution rate with Ti and the growth rate of the Pd nucleus. The complexing agent includes, for example, EDTA (Ethylene-Diamine-Tetra-Acetic acid). The complexing agent is used to prevent the precipitation of metal ions in the electrolyte solution. The hydrofluoric acid may function to precipitate Ti. In this embodiment, 49% diluted hydrofluoric acid is used, but the invention is not limited thereto. The concentration of hydrofluoric acid may be variously controlled according to the test purpose. Thus, the diluted hydrofluoric acid may be contained in the electrolyte solution in a varying amount.

The acidity controlling agent includes, for example, hydrochloric acid, and may be used to control the pH of the electrolyte solution. In this embodiment, 37% diluted hydrochloric acid is used, but the invention is not limited thereto. The concentration of hydrochloric acid may be variously controlled according to the test purpose. Thus, the diluted hydrochloric acid may be contained in the electrolyte solution in a varying amount. Further, another acid may be added or substituted.

The electrolyte solution of the invention may be an acidic electrolyte solution having a pH of about 7 or less. Specifically, if the solution is a strong acid, the reaction rate for substituting Pd for Ti or for growing the Pd nucleus may increase.

The reducing agent includes, for example, glacial acetic acid. The reducing agent, which may be ionized in the electrolyte solution to generate electrons, may function to supply the electrons to ions to be reduced.

The solvent of the electrolyte solution may function to dissolve the contained materials and to control the total concentration of the solution. The amount of the solvent may vary with the size of the substrate to be processed, the area of Ti, and the reaction rate. The concentration may be variously controlled depending on the test purpose. The solvent may be exemplified by deionized water (DIW).

According to some embodiments, the electrolyte solution containing Pd is provided as shown in Table 1 below.

TABLE 1

| Component | Amount |
|---|---|
| $PdCl_2$ | 0.2 g |
| EDTA | 0.5 g |
| Hydrofluoric Acid (49%) | 2 ml |
| Hydrochloric Acid (37%) | 10 ml |
| Glacial Acetic Acid | 50 ml |
| Solvent | 1000 ml |

The electrolyte solution of some embodiments is exemplified by materials and amounts shown in Table 1. However, the electrolyte solution of Table 1 is merely exemplary, and the invention is not limited thereto. Further, although the electrolytic components may be added in diluted concentrations or the amounts given in Table 1, they may be omitted, or may be added in a larger amount according to various test purposes. Moreover, the concentration may be controlled. As well, other additives such as a surfactant, a dispersant, etc., may be further added, depending on the test purpose, if desired. In addition, the hemispherical metal grains according to some embodiments may be formed at about 70° C. for 100 seconds using the electrolyte solution of Table 1. The reaction result is shown in the right micrograph of FIG. 2.

The temperature of the electrolyte solution and the reaction time mentioned above are merely exemplary, and the invention is not limited thereto. The reaction may be conducted for ones of seconds or hundreds of seconds or more, depending on the types of the components of the electrolyte solution. In the invention, the reaction time is in the range from 5 sec to 5 min. The reaction time may be further increased. The temperature of the electrolyte solution may be widely controlled in the range from room temperature to a boiling point. In addition, the reaction may be conducted at about 50° C. to about 95° C. The temperature of the electrolyte solution may be further increased.

The reactivity for producing and growing the Pd nucleus on the metal through substitution of Ti and Pd may be represented on a log scale depending on the reaction conditions. Thus, the proportions of the components of the electrolyte solution of the invention may be varied beyond the range of Table 1.

According to some embodiments, the electrolyte solution of the invention comprises about 0.001 to 0.1 wt % of $PdCl_2$, about 0.002 to 0.25 wt % of complexing agent, about 0.01 to 1 wt % of hydrofluoric acid, about 0.047 to 4.7 wt % of hydrochloric acid, and about 0.2 to 23 wt % of glacial acetic acid in a solvent. Specifically, the relative weight ratios of Pd source:complexing agent:hydrofluoric acid:hydrochloric acid:glacial acetic acid may be controlled in the range of about (0.05 to 5):(0.125 to 12.5):(0.5 to 50):(2.5 to 250):(12.5 to 1250).

In addition, if the components are replaced with other materials, their amounts and relative weight ratios may be changed.

The chemical reaction for forming the hemispherical metal grains through substitution of Ti to Pd is as follows.

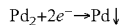

Upon initial reaction, the Pd nuclei may be formed on the lower metal electrode containing Ti, and are then grown. Thus, the size of the Pd nuclei may be determined by the reaction time in the electrolyte solution. Further, the surface area of the lower metal electrode containing Ti may be increased by the size of the Pd nuclei.

Therefore, the method of fabricating the metal capacitor according to some embodiments of the invention may be conducted by dipping a substrate having a lower metal electrode 260*b* containing Ti into an electrolyte solution containing Pd and subjecting it to electroless plating.

The surface area of the lower metal electrode covered with the hemispherical metal grains is increased depending on the density and size of the hemispherical metal grains.

Figure 6:
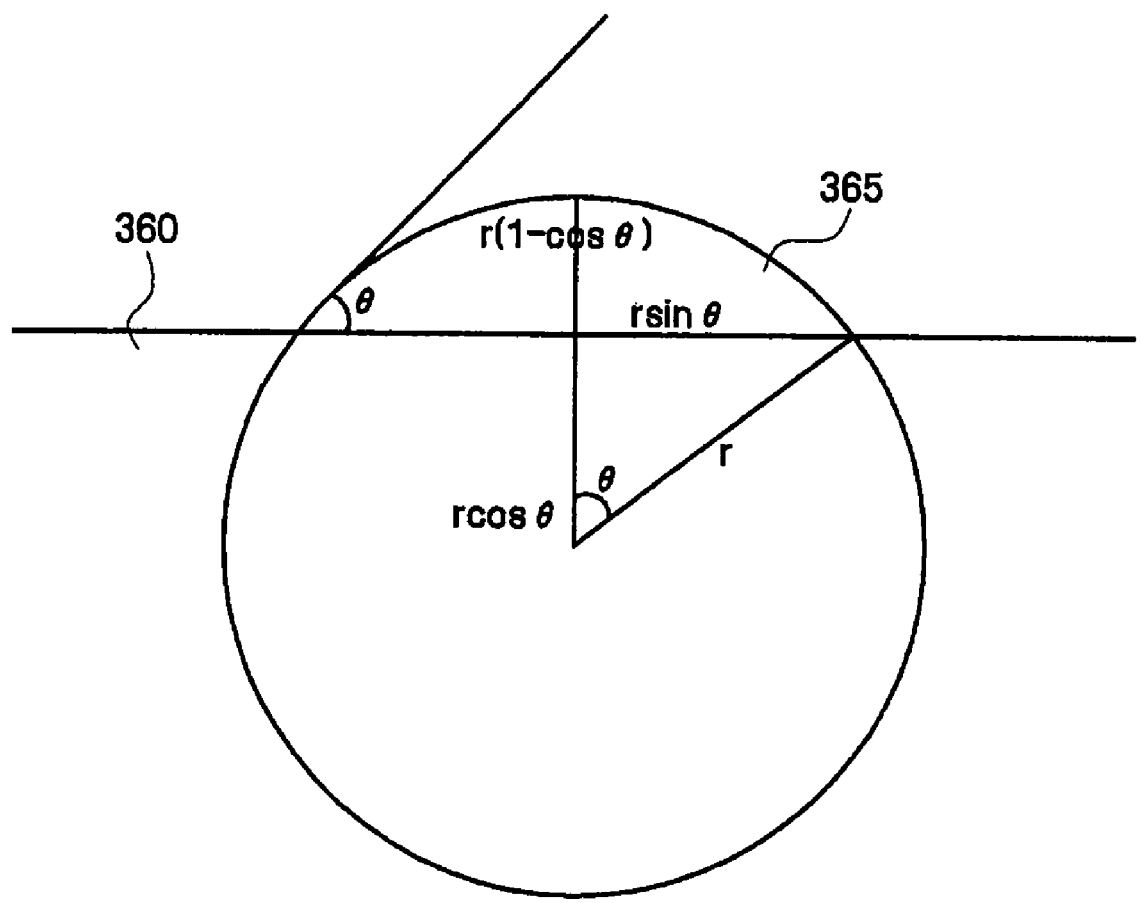
FIG. 6 is a view showing the increase in surface area due to the hemispherical metal grains in the invention.

FIG. 6 is a view showing the increase in the surface area due to the hemispherical metal grains 365 according to the invention.

As shown in FIG. 6, if the hemispherical metal grains 365 are formed into a perfectly hemispherical shape, the surface area of the hemispherical metal grains 365 is defined as $2\pi r^2 (1-\cos\theta)$, and the area of the surface of the electrode occupied by the hemispherical metal grains is defined as $\pi r^2 \sin^2\theta$. Thus, the surface area is increased by $\{2(1-\cos\theta)/\sin^2\theta\}$ depending on θ. When θ is 30°, the increase in the surface area is about 7.2%. When θ is 45°, the increase in the surface area is about 17.2%. Further, the increase in the surface area is about 33.3% at θ=60°. Therefore, when the size of the hemispherical metal grains 365 is controlled depending on the test purpose, the surface of the lower metal electrode 360 may be expected to increase as desired.

In addition, the total surface area is increased depending on the proportion of the surface of the lower metal electrode occupied by the hemispherical metal grains. The proportion of the surface of the lower metal electrode occupied by the hemispherical metal grains is regarded as an average density of the hemispherical metal grains. The total surface area is increased by a value obtained by multiplying the increase in the surface area due to the hemispherical metal grains depending on θ and the average density. For example, when θ is 60° and the average density of the hemispherical metal grains is 50%, the total surface area is increased by 33.3×0.5=16.66%.

The process of forming the hemispherical metal grains on the lower metal electrode of the metal capacitor to increase the capacitance of the capacitor is also expected to provide better results in the other preferred embodiments.

Embodiments of the invention will now be described in a non-limiting way.

According to some embodiments of the invention, there is provided a metal capacitor including a lower metal electrode containing Ti; hemispherical metal grains containing Pd and formed on the upper surface of the lower metal electrode containing Ti; a dielectric layer formed on the lower metal electrode containing Ti and the hemispherical metal grains containing Pd; and an upper metal electrode formed on the dielectric layer. In the metal capacitor, the lower metal electrode containing Ti may be a TiN electrode.

The metal capacitor may further include an insulating layer formed beneath the lower metal electrode, and a Ti layer interposed between the lower metal electrode and the insulating layer.

The metal capacitor may further include hemispherical metal grains formed on the side surface of the lower metal electrode containing Ti. As such, the dielectric layer may be formed on the upper surface and side surface of the lower metal electrode containing Ti, and the upper metal electrode may be formed over all of the dielectric layer.

In addition, according to other embodiments of the invention, there is provided a metal capacitor including a plurality of transistors formed on a substrate; a first insulating layer formed all over the plurality of transistors; a via plug vertically formed through the first insulating layer to be electrically connected to the substrate; a second insulating layer formed on the first insulating layer and having a hole for exposing the upper surface of the via plug; a lower metal electrode containing Ti, which is brought into contact with the exposed upper surface of the via plug and the side wall of the hole, and which is formed to have an inner wall and an outer wall; hemispherical metal grains containing Pd and formed on the lower metal electrode containing Ti; a dielectric layer formed on the lower metal electrode containing Ti and the hemispherical metal grains containing Pd; and an upper metal electrode formed on the dielectric layer.

The lower metal electrode containing Ti may include TiN, and a Ti layer interposed between the lower metal electrode containing Ti and the hole may be further included.

The hemispherical metal grains containing Pd may be formed on the inner wall, the outer wall and the upper surface of the metal electrode containing Ti.

In addition, a method of fabricating a metal capacitor according to some embodiments is provided, the method including forming a lower metal electrode containing Ti; dipping the lower metal electrode containing Ti into an electrolyte solution containing Pd, thus forming hemispherical metal grains containing Pd on the lower metal electrode; forming a dielectric layer on the lower metal electrode; and forming an upper metal electrode on the dielectric layer.

The lower metal electrode containing Ti may include TiN.

The method may further include forming an insulating layer beneath the lower metal electrode, and providing a Ti layer between the lower metal electrode and the insulating layer.

The electrolyte solution containing Pd may be an acidic electrolyte solution including palladium chloride ($PdCl_2$), hydrofluoric acid, hydrochloric acid, a reducing agent, and a complexing agent.

As such, the reducing agent may be glacial acetic acid, and the complexing agent may be ethylene-diamine-tetra-acetic acid.

The electrolyte solution may include 0.001 to 0.1 wt % of palladium chloride ($PdCl_2$), 0.01 to 1 wt % of 40 to 60% diluted hydrofluoric acid, 0.047 to 4.7 wt % of 30 to 50% diluted hydrochloric acid, 0.2 to 23 wt % of the reducing agent, and 0.002 to 0.25 wt % of the complexing agent.

Also, a method of fabricating a metal capacitor according to other embodiments of the invention is provided, the method including forming a plurality of transistors on a substrate; forming a first insulating layer all over the plurality of transistors; forming a conductive via plug through the first insulating layer provided between the plurality of transistors to the substrate; forming a second insulating layer on the first insulating layer and the via plug; forming a third insulating layer on the second insulating layer; forming a hole through the second insulating layer and the third insulating layer for exposing the via plug; forming a lower metal electrode containing Ti within the hole; dipping the lower metal electrode into an electrolyte solution containing Pd, thus forming hemispherical metal grains containing Pd on the lower metal electrode; forming a dielectric layer on the lower metal electrode; and forming an upper metal electrode on the dielectric layer.

The first insulating layer and the third insulating layer may include silicon oxide, and the second insulating layer may include silicon nitride.

The lower metal electrode containing Ti may include TiN, and the method may further include providing a Ti layer between the lower metal electrode containing Ti and the hole.

The electrolyte solution containing Pd may be an acidic electrolyte solution including palladium chloride ($PdCl_2$), hydrofluoric acid, hydrochloric acid, a reducing agent, and a complexing agent.

As such, the reducing agent may be glacial acetic acid, and the complexing agent may be ethylene-diamine-tetra-acetic acid.

The electrolyte solution may include 0.001 to 0.1 wt % of palladium chloride ($PdCl_2$), 0.01 to 1 wt % of 40 to 60% diluted hydrofluoric acid, 0.047 to 4.7 wt % of 30 to 50% diluted hydrochloric acid, 0.2 to 23 wt % of the reducing agent, and 0.002 to 0.25 wt % of the complexing agent.

The dipping the metal layer into the electrolyte solution containing Pd to substitute Pd for Ti may be conducted using the electrolyte solution at 50 to 90° C. for 1 to 5 min.

The electrolyte solution may include palladium chloride, the complexing agent, hydrofluoric acid, hydrochloric acid, and the reducing agent at weight ratios of (0.05 to 5):(0.125 to 12.5):(0.5 to 50):(2.5 to 250):(12.5 to 1250).

As described above, the invention provides a metal capacitor including a lower metal electrode having hemispherical metal grains thereon. According to the invention, the electrode of the metal capacitor has a greatly increased surface area, and thus it is possible to realize stable operation of the device thanks to high capacitance. Further, the metal capacitor can be fabricated without greatly deviating from conventional fabrication processes.

Although the preferred embodiments of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a metal capacitor, the method comprising:
   forming a lower metal electrode containing titanium;
   dipping the lower metal electrode into an electrolyte solution containing palladium, wherein the electrolyte solution is an acidic electrolyte solution comprising a palladium compound, hydrofluoric acid, an acidity controlling agent, a reducing agent, and a complexing agent, thereby forming hemispherical metal grains containing palladium on the lower metal electrode;
   forming a dielectric layer on the lower metal electrode; and
   forming an upper metal electrode on the dielectric layer.

2. The method of claim 1, wherein the lower metal electrode is formed of TiN.

3. The method of claim 1, further comprising forming an insulating layer beneath the lower metal electrode, and forming a titanium layer between the lower metal electrode and the insulating layer.

4. The method of claim 1, wherein the palladium compound of the acidic electrolyte solution is palladium chloride ($PdCl_2$) and wherein the acidity controlling agent of the acidic electrolyte solution is hydrochloric acid.

5. The method of claim 4, wherein the reducing agent is glacial acetic acid, and the complexing agent is ethylene-diamine-tetra-acetic acid.

6. The method of claim 4, wherein the electrolyte solution comprises about 0.001 to 0.1 wt % of palladium chloride ($PdCl_2$), about 0.01 to 1 wt % of 40 to 60% diluted hydrofluoric acid, about 0.047 to 4.7 wt % of 30 to 50% diluted hydrochloric acid, about 0.2 to 23 wt % of the reducing agent, and about 0.002 to 0.25 wt % of the complexing agent.

7. A method of fabricating a metal capacitor, the method comprising:
   forming a plurality of transistors on a substrate;
   forming a first insulating layer on the plurality of transistors;
   forming a conductive via plug through the first insulating layer to contact the substrate;
   forming a second insulating layer on the first insulating layer and the via plug;
   forming a third insulating layer on the second insulating layer;
   forming a hole through the second insulating layer and the third insulating layer thereby exposing the via plug;
   forming a lower metal electrode containing titanium within the hole;
   dipping the lower metal electrode into an electrolyte solution containing palladium, wherein the electrolyte solution is an acidic electrolyte solution comprising a palladium compound, hydrofluoric acid, an acidity controlling agent, a reducing agent, and a complexing agent, thereby forming hemispherical metal grains containing palladium on the lower metal electrode;
   forming a dielectric layer on the lower metal electrode; and
   forming an upper metal electrode on the dielectric layer.

8. The method of claim 7, wherein the first insulating layer and the third insulating layer are formed of silicon oxide, and the second insulating layer is formed of silicon nitride.

9. The method of claim 7, further comprising forming a titanium layer between the lower metal electrode and the hole, wherein the lower metal electrode is formed of TiN.

10. The method of claim 7, wherein the palladium compound of the acidic electrolyte solution is palladium chloride ($PdCl_2$), and wherein the acidity controlling agent of the acidic electrolyte solution is hydrochloric acid.

11. The method of claim 10, wherein the reducing agent is glacial acetic acid, and the complexing agent is ethylene-diamine-tetra-acetic acid.

12. The method of claim 11, wherein the electrolyte solution comprises about 0.001 to 0.1 wt % of palladium chloride ($PdCl_2$), about 0.01 to 1 wt % of 40 to 60% diluted hydrofluoric acid, about 0.047 to 4.7 wt % of 30 to 50% diluted hydrochloric acid, about 0.2 to 23 wt % of the reducing agent, and about 0.002 to 0.25 wt % of the complexing agent.

13. The method of claim 7, wherein dipping the lower metal electrode into the electrolyte solution is conducted using the electrolyte solution at about 50 to 90° C. for about 1 to 5 min.

14. The method of claim 13, wherein the electrolyte solution comprises palladium chloride, the complexing agent, hydrofluoric acid, hydrochloric acid, and the reducing agent at weight ratios of about (0.05 to 5):(0.125 to 12.5):(0.5 to 50):(2.5 to 250):(12.5 to 1250).

* * * * *